Nov. 16, 1965 J. M. BENTLEY 3,218,467

SEMICONDUCTOR AMPLIFIER

Filed Nov. 21, 1961

WITNESSES

John E. Healy, Jr.

William L. Gates

INVENTOR

John M. Bentley

BY Ernest P. Klipfel

ATTORNEY 3,218,467
SEMICONDUCTOR AMPLIFIER

John M. Bentley, Glen Burnie, Md., assignor to Westinghouse Electric Corporation, East Pittsburgh, Pa., a corporation of Pennsylvania Filed Nov. 21, 1961, Ser. No. 153,846
6 Claims. (Cl. 307—88.5)

This invention relates generally to semiconductor pulse amplifier circuits and more particularly to such circuits utilizing a tunnel diode as the active amplifying element.

The advent of the tunnel diode and other semiconductor devices exhibiting similar current-voltage characteristics has provided many attractive properties for their use in amplifier circuitry such as that used in computers where linearity of signal gain is not as necessary as high gain and fast response. The high speed with which switching can occur, their low power consumption, small size and relative insensitivity to environmental conditions are all important features which make the tunnel diode particularly suitable for computer applications. Also molecular engineering techniques can be employed to fabricate the circuitry involved.

An object of the present invention, therefore, is to provide a pulse amplifier circuit utilizing a tunnel diode as the active element.

Another object of the present invention is to provide a semiconductor amplifier circuit which provides high speed with reduced cost.

Another object of the present invention is to provide a semiconductor amplifier which is capable of providing a high gain and fast response for a pulse where linearity is not an important consideration.

Further objects and advantages of the present invention will be readily apparent from the following detailed description taken in conjunction with the drawings in which.

Figure 3:
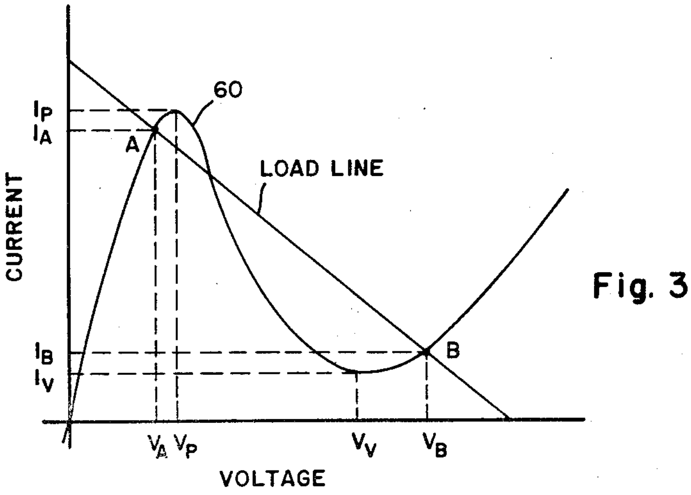
FIGURE 3 illustrates the characteristic curve of a typical tunnel diode utilized in the present invention including the associated load line required to make the subject circuit operative.

The tunnel diode is a semiconductor device exhibiting the phenomena of quantum mechanical tunneling. Referring to FIG. 3, it can be seen that for reverse bias, the resistance of the tunnel diode is small. In the forward direction, a voltage across the tunnel diode increases the current therethrough to a sharp maximum $I_P$ on a portion of the characteristic curve to be referred to as the low voltage side or state. Further increase in the voltage across the diode results in the negative resistance portion of the characteristic curve 60 wherein the current through the diode drops to a deep and broad minimum referred to as the valley current $I_V$. This negative resistance region is caused by the quantum mechanical tunneling of majority carriers across the junction in highly doped p-n junctions. These majority charge carriers can tunnel through the junction barrier and appear with the speed of light at the other side. Still further increase in the votlage across the diode causes the current to increase again on a portion of the characteristic curve 60 to be referred to as the high voltage side or state. The current increases to a maximum value $I_B$ corresponding to the maximum voltage $V_B$ at point B. This point is determined by the circuit parameters and the magnitude of the bias voltage applied. The breakover current level is determined by the peak coming current $I_P$ and is referred to as the threshold or excitation level of the tunnel diode. For the purposes of this invention, the term "tunnel diode" is herein meant to include all devices exhibiting the aforementioned characteristics.

Figure 2:
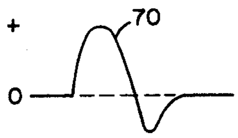
FIGURE 2 illustrates an output waveform which appears at the output terminals of the present invention.

In accordance with the present invention, a tunnel diode pulse amplifier is provided having the sole characteristic of putting out a large amplitude pulse at terminal 55 when a relatively small pulse is applied to the input terminal 41 and wherein tunnel diode 10 in combination with the transformer 20 perform the desired amplification. The subject circuitry operates on a load line having two stable points A and B, as shown by FIG. 3. The circuit is biased such that the steady state operating point A lies on the low voltage side of the current voltage characteristic curve. A positive pulse of sufficient amplitude applied to the input terminal 41 causes breakover by exceeding the threshold value $I_P$ switching the tunnel diode to its second stable operating point B. An output pulse 70 as shown by FIG. 2 is generated in the transformer 20 due to the change of current as the tunnel diode shifts operating points. The subject circuit also utilizes means 50 to provide a feedback circuit for causing the tunnel diode to reassume its steady state operating point A on the low side of the characteristic curve once the tunnel diode has been triggered by the input pulse to the second steady state operating point B on the high voltage side of the characteristic curve.

Figure 1:
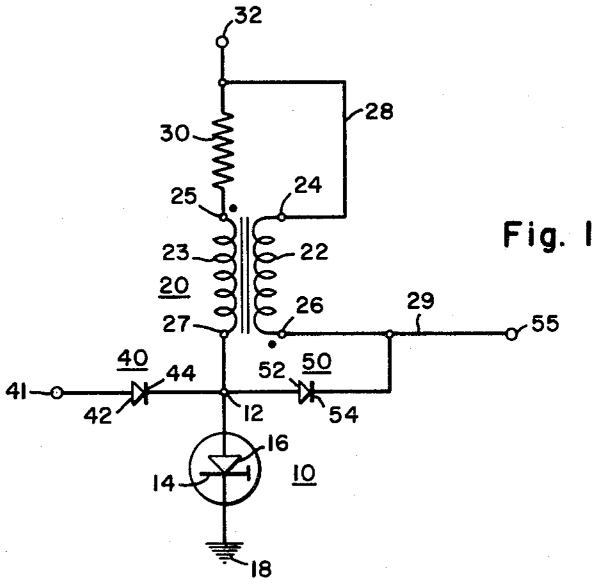
FIGURE 1 is an electrical schematic diagram of an illustrative embodiment of the present invention.

Specifically, referring to FIG. 1, tunnel diode 10 is connected to transformer 20 such that the anode element 16 is connected to the primary winding 20 at the transformer terminal 27 while the cathode element 14 of tunnel diode 10 is connected to a point of common reference potential 18. A bias supply voltage, not shown, is impressed upon the subject circuit at terminal 32. A load resistance 30 is provided in order to obtain the required load line shown in FIG. 3 and is connected on one side to the voltage suply terminal 32 and on the other side to terminal 25 of the primary winding 23.

An input means 40, shown in the present embodiment as a semiconductor diode, is connected by the anode element 42 to input terminal 41. The cathode element 44 is connected to the anode element 16 of tunnel diode 10 at junction 12. The output signal shown substantially as in FIG. 2 is provided across the secondary winding 22 of transformer 20 at terminal 26 which is connected by means of lead 29 to the output terminal 55. The alternate terminal 24 of the secondary winding 22 is connected to the bias voltage source, not shown, through lead 28. A portion of the output signal appearing across the secondary winding 22 is fed back to the anode 16 of tunnel diode 11 by means of the semiconductor diode 50 which has its cathode element 54 connected to the transformer terminal 26 and wherein the anode 52 is connected to the anode 16 at junction 12.

In operation, tunnel diode 10 is biased by means of resistance 30 such that it assumes a steady state operating point corresponding to point A as shown in FIG. 3 thereby providing a current $I_A$ which is slightly less than the peak or threshold current $I_P$. A positive pulse applied to terminal 41 through diode 40 will cause the voltage to move on the voltage characteristic curve as shown by FIG. 3, from $V_A$ towards $V_P$. The voltage of this input pulse need not be any greater than is required to raise the voltage beyond point $V_P$, however, an input pulse of a smaller magnitude will not activate the circuit. Once the input pulse has raised the voltage across tunnel diode past the point $V_P$, the negative resistance of the tunnel diode 10 swings the voltage and current to point B resulting in a voltage $V_B$ and a current $I_B$. The change of current with respect to time and the diode 10 in switching from the threshold value $I_P$ to point B induces a current in transformer 20 which is positive going at terminal 26 because the transformer secondary winding 22 is poled opposite from the primary winding 23 as shown by the respective dots in the vicinity of terminals 25 and 26. This positive going potential which appears at terminal 26 comprises the output pulse which is translated to terminal 55. However, this output pulse is also applied to semiconductor diode 50 such that the positive pulse increases the back bias at the cathode element 54. The voltage induced in the primary winding 23 is governed by the differential equation, $V=Ldi/dt$, wherein L represents the inductance of the primary winding and the term $di/dt$ represents the change of current with respect to time. The rate of change of current through the tunnel diode 10 approaches zero at point B. Likewise, the output voltage of the transformer drops to zero as the voltage swing approaches point B; however, the collapse of the magnetic field within the transformer 20 induces a negative overshoot voltage due to the flywheel effect which can be seen by reference to the output waveform 70 as shown in FIG. 2. As the output voltage at terminal 26 of the secondary 22 goes negative, it is coupled into the anode circuit of the tunnel diode 10 to further decrease the current through it due to the fact that the negative voltage now forward biases semiconductor diode 50. This reduction of current in tunnel diode 10 below the valley current $I_V$ causes the potential across tunnel diode 10 to decrease immediately towards zero. This effect further causes a negative swing in the output potential at terminal 26 of the transformer 20 which in turn further biases semiconductor 50 in a forward direction. This combined action during the interval the tunnel diode is conducting from point B towards zero causes the operation of the tunnel diode to reset and assume its original operating point A, rendering the amplifier ready for a succeeding input pulse. Thus it is possible to obtain a tunnel diode amplifier which has high gain and fast response for small input pulses.

While this invention has been described with a particular degree of exactness for the purposes of illustration, it is to be understood that all equivalents, alterations and modifications within the spirit and scope of the present invention are herein meant to be included.

I claim as my invention:

1. A pulse amplifier comprising, in combination: a first semiconductor diode exhibiting a negative conductance region over a portion of its current-voltage characteristic curve; semiconductor diode means operably connected to said first diode for switching said first diode through said negative conductance region; means for biasing said first diode to a first stable operating point; a load impedance connected to said first diode and said means for biasing defining a load line having a slope less than the slope of said negative conductance region thereby establishing two stable operating points on said characteristic curve; transformer means including a primary and a secondary winding, said primary winding connected in series with said first diode and said load impedance and responsive to the rate of change of current therein for inducing a bipolar output voltage in said secondary winding; means connected between said secondary winding and said first diode for providing a feedback voltage comprising a predetermined portion of said output voltage to automatically reduce the voltage across said first diode below the valley voltage causing said first diode to assume said first operating point after the threshold value thereof has been exceeded.

2. A pulse amplifier comprising, in combination: a first diode exhibiting a negative conductance region over a portion of its current-voltage characteristic curve; means operably connected for impressing an input pulse across said first diode to switch said first diode through said negative conductance region; means for biasing said first diode to a first stable operating point; a load impedance connected to said first diode and said means for biasing defining a load line having a slope less than the slope of said negative conductance region thereby establishing two stable operating points on said characteristic curve; transformer means including a primary and a secondary winding, said primary winding connected in series with said first diode and said load impedance and responsive to the rate of change of current when said first diode switches between said two stable operating points thereby inducing an output voltage having a positive and negative polarity in said secondary winding; second diode means connected between said secondary winding and said first diode for providing a feedback circuit to automatically reset said first diode to said first operating point after the threshold value has been exceeded by impressing said negative polarity output voltage across said first diode.

3. A pulse amplifier having an input pulse and providing an output pulse, comprising in combination: a semiconductor device exhibiting a negative resistance region over a portion of the current-voltage characteristic curve including a low voltage positive resistance region and a high voltage positive resistance region; means for biasing said device to a first operating point in the low voltage region of said characteristic curve; means for pulsing said device to exceed the threshold level so that said device switches to a second operating point on the high voltage side of said characteristic curve; output means operably connected to said device for translating said output signal; induction means responsive to the change of current in said device for providing said output signal having a larger magnitude than said input signal; semiconductor diode means operatively connected between said induction means and said semiconductor means, and being responsive to the negative overshoot of said output signal for switching said device from said second operating point back to said first operating point, thereby rendering said device ready to receive a succeeding input signal.

4. A pulse amplifier comprising, in combination: a semiconductor device having an anode and a cathode and exhibiting a negative resistance region over a portion of its current-voltage characteristic curve, said cathode connected to a point of reference potential; transformer means including a primary and a secondary winding inductively coupled therein, said transformer means being responsive to the change in current of said semiconductor device for providing an output signal across said secondary winding having alternately positive and negative polarity; means for biasing said device through said primary winding for establishing a load line to provide a low voltage stable state and a high voltage stable state; input means connected to said anode for translating an input signal to said semiconductor device sufficient to exceed threshold voltage level; feedback means connected between said anode and said secondary winding for providing a feedback path for the portion of said output signal having said negative polarity to force said device into said low voltage state after breakover has occurred and said high voltage state having been reached by reducing the current flowing in said semiconductor device below the magnitude necessary to maintain said high voltage state.

5. A pulse amplifier comprising, in combination: a tunnel diode having an anode and a cathode; said cathode being connected to a point of reference potential; transformer means including a primary winding and a secondary winding inductively coupled to one another, said transformer means being responsive to the rate of change in current of said tunnel diode to provide an output signal of a first and second polarity; means for biasing said tunnel diode through said primary winding for establishing a load line having a low voltage stable operating point and a high voltage stable operating point; semiconductor diode input means connected to said anode for translating an input signal to said anode sufficient to exceed the breakover point of said tunnel diode, semiconductor diode means operably connected between said anode and said secondary winding being poled to provide a voltage to said tunnel diode in accordance with said second polarity of said output signal only, causing said tunnel diode to assume said low voltage operating point after said threshold voltage has been exceeded and said high voltage operating point has been reached.

6. A pulse amplifier comprising in combination: a tunnel diode having an anode and a cathode and exhibiting a negative resistance region over a portion of its current voltage characteristic curve; said cathode connected to a point of reference potential; transformer means including a primary and a secondary winding inductively coupled, said transformer means being responsive to the rate of change with respect to time of current in said tunnel diode to provide an output signal across said secondary winding; a resistance means for biasing said device through said primary winding for establishing a load line having a low voltage state and a high voltage state; semiconductor input means connected to said anode being poled to translate an input signal to said tunnel diode sufficient to exceed the threshold level thereof; semiconductor diode means connected between said anode and said secondary winding being poled to provide a feedback path for the overshoot voltage induced by the flywheel effect resulting from the response of said transformer means for driving said tunnel diode into said low voltage state after the threshold value has been exceeded and said tunnel diode has switched to said high voltage state.

References Cited by the Examiner

UNITED STATES PATENTS

| | | | |
|---|---|---|---|
| 3,040,186 | 6/1962 | Van Duzer | 307—88.5 |
| 3,094,630 | 6/1963 | Rapp et al. | 307—88.5 |
| 3,096,445 | 7/1963 | Herzog | 307—88.5 |
| 3,114,846 | 12/1963 | Pressman | 307—88.5 |
| 3,115,584 | 12/1963 | Yao | 307—88.5 |
| 3,115,585 | 12/1963 | Feller et al. | 307—88.5 |
| 3,121,176 | 2/1964 | Burns et al. | 307—88.5 |
| 3,133,206 | 5/1964 | Bergman et al. | 307—88.5 |
| 3,185,860 | 5/1965 | Ur | 307—88.5 |

OTHER REFERENCES

Proceedings of the IRE, June 1961, page 1092, "Tunnel-Diode Binary Counter Circuit," by Hanoch Ur.

DAVID J. GALVIN, *Primary Examiner.*

JOHN W. HUCKERT, *Examiner.*